(12) United States Patent
Lin

(10) Patent No.: US 12,418,262 B2
(45) Date of Patent: Sep. 16, 2025

(54) LOW NOISE CRYSTAL OSCILLATOR

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 18/443,607

(22) Filed: Feb. 16, 2024

(65) Prior Publication Data

US 2025/0266792 A1     Aug. 21, 2025

(51) Int. Cl.
*H03B 5/12*    (2006.01)
*H03B 1/04*    (2006.01)

(52) U.S. Cl.
CPC ............. *H03B 5/1228* (2013.01); *H03B 1/04* (2013.01); *H03B 2200/0088* (2013.01)

(58) Field of Classification Search
CPC . H03B 5/1228; H03B 1/04; H03B 2200/0088
USPC .................................. 331/158, 116 FE, 183
See application file for complete search history.

(56) References Cited

U.S. PATENT DOCUMENTS 6,191,661 B1 *   2/2001   Tsukagoshi .............. H03B 5/36
                                                         331/74
2012/0154066 A1 *   6/2012   Kubota ..................... H03L 5/00
                                                         331/116 FE \* cited by examiner

*Primary Examiner* — Arnold M Kinkead
(74) *Attorney, Agent, or Firm* — McClure, Qualey & Rodack, LLP

(57) ABSTRACT

A crystal oscillator having a voltage regulator configured to receive a first power supply voltage and output a second power supply voltage; a source follower configured to receive the second power supply voltage and output a third power supply voltage in accordance with a control voltage; a first inverter operating under the third power supply voltage and configured to receive a first oscillatory signal from a first node and output a second oscillatory signal at a second node; a second inverter operating under the third power supply voltage and configured to output a third oscillatory signal; a crystal placed across the first node and a second node; a first shunt capacitor configured to shunt the first node to ground; a second shunt capacitor configured to shunt the second node to ground; and a clocked lowpass filter configured to output the control voltage in accordance with the pulsed signal.

8 Claims, 4 Drawing Sheets

LOW NOISE CRYSTAL OSCILLATOR

BACKGROUND OF THE INVENTION

Field of the Invention

The present invention generally relates to crystal oscillator and more particularly to crystal oscillator having low noise and good noise immunity.

Description of Related Art

Persons of ordinary skill in the art understand terms and basic concepts related to microelectronics that are used in the context of this disclosure, such as "voltage," "current," "signal," "oscillator," "clock," "capacitor," "resistor," "transistor," "NMOST (n-channel metal-oxide semiconductor transistor)," "PMOST (p-channel metal-oxide semiconductor transistor)," "source," "gate," "drain," "node," "ground node," "power supply node," "inverter," "switch," "source follower," "lowpass filter," "operational amplifier," and "noise." Terms and basic concepts like these in the context of this present disclosure are apparent to those of ordinary skill in the art and thus will not be explained in detail.

Those of ordinary skill in the art can recognize a resistor symbol, a capacitor symbol, a switch symbol, an inverter symbol, an operational amplifier symbol, and a NAND gate symbol. Those of ordinary skill in the art can also recognize a PMOST (p-channel metal-oxide semiconductor transistor) symbol and a NMOST (n-channel metal-oxide semiconductor transistor) symbol, and can identify a "source" terminal, a "gate" terminal, a "drain" terminal, and a "body" terminal thereof. For brevity, in this present disclosure, in a context of reference to a NMOST or a PMOST, a "source terminal" is simply referred to as "source," a "gate terminal" is simply referred to as "gate," and a "drain terminal" is simply referred to as "drain."

Those of ordinary skills in the art can read schematics of a circuit comprising resistors, capacitors, NMOST, PMOST, inverter, switch, operational amplifier, and so on, and do not need a detailed description about how one of them connects with another in the schematics.

As shown in FIG. 1, a conventional crystal oscillator 100 comprises: a crystal 160; two capacitors 161 and 162; an inverter 110 comprising NMOST 111 and PMOST 112; and a voltage regulator 150. Throughout this disclosure, "$V_{DD}$" denotes a power supply node. Crystal oscillator 100 is well known in the prior art and thus not described in detail here. Voltage regulator 150 is used to establish a supply voltage $V_{SP}$ that is substantially independent of a voltage at the power supply node "$V_{DD}$"; this way, a noise at the power supply node "$V_{DD}$" can be effectively rejected. However, the voltage regulator 150 itself is usually a significant noise contributor. In other words, it provides noise immunity (against the noise from the power supply node "$V_{DD}$") but unfortunately also introduces circuit noise of its own.

What is desired is a crystal oscillator with a voltage regulation scheme that can have good noise immunity against the noise from the power supply node without introducing much circuit noise of its own.

BRIEF SUMMARY OF THIS INVENTION

An objective of embodiments of the invention is to have a voltage regulation scheme for a crystal oscillator that can provide noise immunity against a noise at a power supply node yet does not introduce much circuit noise.

In an embodiment, a crystal oscillator comprises: a voltage regulator configured to receive a first power supply voltage and output a second power supply voltage; a source follower configured to receive the second power supply voltage and output a third power supply voltage in accordance with a control voltage; a first inverter operating under the third power supply voltage and configured to receive a first oscillatory signal at a first node and output a second oscillatory signal at a second node; a second inverter operating under the third power supply voltage and configured to receive the second oscillatory signal and output a third oscillatory signal; a crystal placed across the first node and a second node; a first shunt capacitor configured to shunt the first node to ground; a second shunt capacitor configured to shunt the second node to ground; and a clocked lowpass filter configured to receive a reference voltage and output the control voltage in accordance with the pulsed signal, which is synchronous with the third oscillatory signal.

In an embodiment, a crystal oscillator comprises: a voltage regulator configured to receive a first power supply voltage and output a second power supply voltage; a source follower configured to receive the second power supply voltage and output a third power supply voltage in accordance with a control voltage; a first inverter operating under the third power supply voltage and configured to receive a first oscillatory signal at a first node and output a second oscillatory signal at a second node; a crystal placed across the first node and a second node; a first shunt capacitor configured to shunt the first node to ground; a second shunt capacitor configured to shunt the second node to ground; and a clocked lowpass filter configured to receive a reference voltage and output the control voltage in accordance with the pulsed signal, which is synchronous with the second oscillatory signal.

DETAILED DESCRIPTION OF THIS INVENTION

The present invention relates to crystal oscillator. While the specification describes several example embodiments of the invention considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the invention.

A source follower can be embodied by an NMOST (n-channel metal oxide semiconductor transistor), wherein an output voltage is established at its source in accordance with a control voltage at its gate under a power supply provided at its drain.

An NMOST is said to be configured in a diode-connect topology when its gate and its drain are connected to the same node.

A circuit is a collection of a transistor, a capacitor, an inductor, a resistor, and/or other electronic devices interconnected in a certain manner to embody a certain function. A network is a circuit or a collection of circuits configured to embody a certain function.

In this present disclosure, a "circuit node" is simply referred to as a "node" for short, as the meaning is clear from a context of microelectronics and won't cause confusion.

In this present disclosure, a signal is a voltage of a variable level that can vary with time. A (voltage) level of a signal at a moment represents a state of the signal at that moment.

A logical signal is a signal of two states: a low state and a high state. The low state is also referred to as a "0" state, while the high stage is also referred to as a "1" state. Regarding a logical signal Q, "Q is high" or "Q is low," means "Q is in the high state" or "Q is in the low state." Likewise, "Q is 1" or "Q is 0," means "Q is in the 1 state" or "Q is in the 0 state."

When a logical signal toggles from low to high, it undergoes a low-to-high transition and a rising edge occurs. When a logical signal toggles from high to low, it undergoes a high-to-low transition and a falling edge occurs. A pulse of a logical signal starts at a rising edge and ends at a subsequent falling edge.

A first logical signal is said to be a logical inversion of a second logical signal if the first logical signal and the second logical signal are always in opposite states. That is, when the first logical signal is 0 (low), the second logical signal is 1 (high); when the first logical signal is 1 (high), the second logical signal is 0 (high). When a first logical signal is a logical inversion of a second logical signal, the first logical signal and the second logical signal are said to be complementary to one another.

A clock is a logical signal that cyclically toggles back and forth between a low state and a high state.

Figure 1:
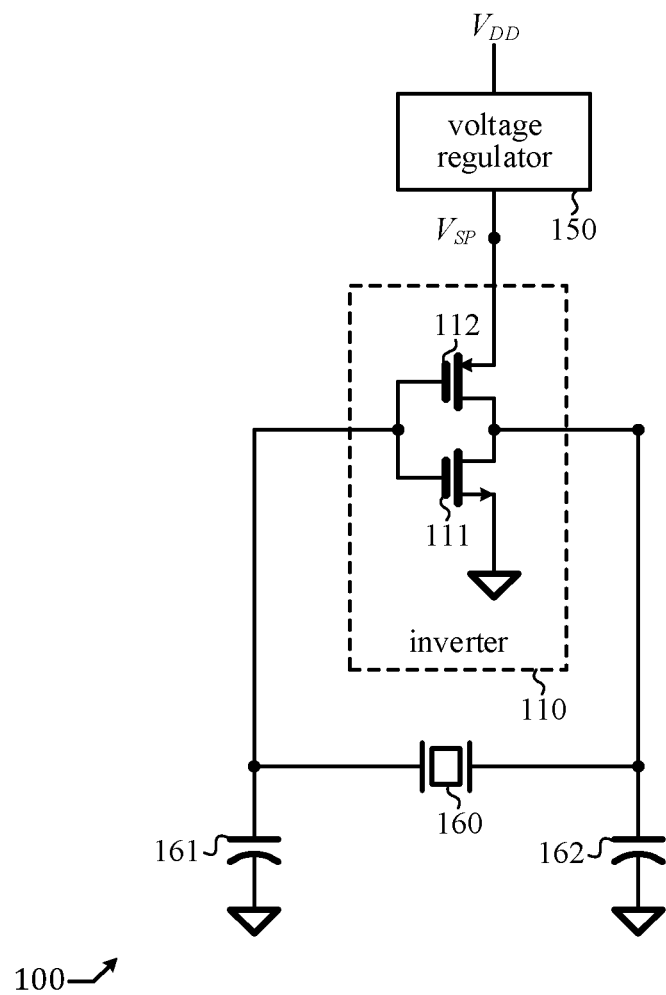
FIG. 1 shows a schematic diagram of a prior art crystal oscillator.
Figure 2:
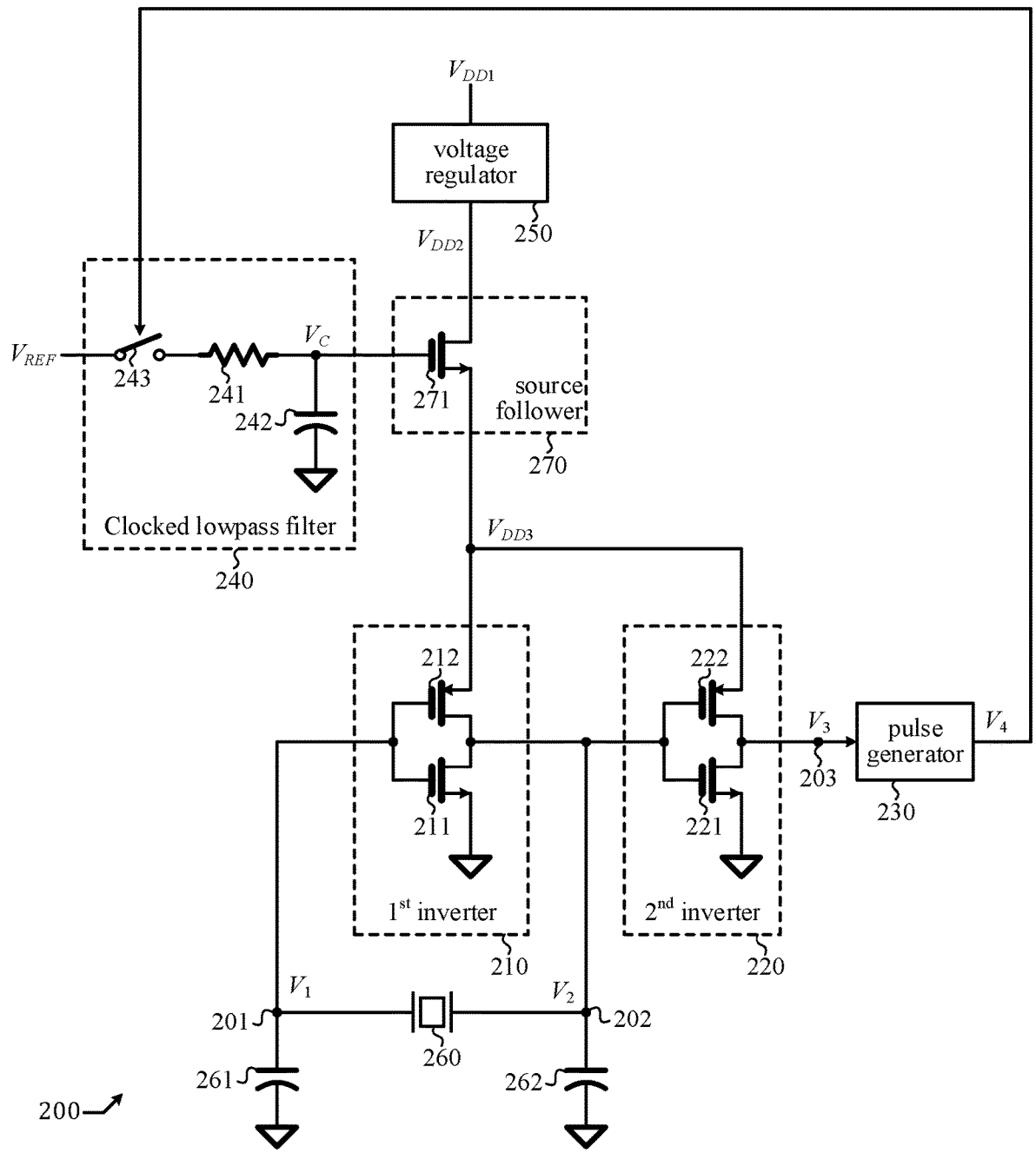
FIG. 2 shows a schematic diagram of a crystal oscillator in accordance with an embodiment of the present disclosure.

As shown in FIG. 2, a crystal oscillator 200 in accordance with an embodiment of the present invention comprises: a voltage regulator 250 configured to receive a first power supply voltage $V_{DD1}$ and output a second power supply voltage $V_{DD2}$; a source follower 270 configured to output a power third supply voltage $V_{DD3}$ in accordance with a control voltage $V_C$ under the second power supply voltage $V_{DD2}$; a first inverter 210 comprising NMOST 211 and PMOST 212, operating under the third power supply voltage $V_{DD3}$, and configured to receive a first oscillatory signal $V_1$ at a first node 201 and output a second oscillatory signal $V_2$ at a second node 202; a crystal placed across the first node 201 and the second node 202; a first shunt capacitor 261 configured to shunt the first node 201 to ground; a second shunt capacitor 262 connected to shunt the second node 202 to ground; a second inverter 220 comprising NMOST 221 and PMOST 222, operating under the third power supply voltage $V_{DD3}$, and configured to receive the second oscillatory signal $V_2$ and output a third oscillatory signal $V_3$ at a third node 203; a pulse generator 230 configured to receive the third oscillatory signal $V_3$ and output a pulsed signal $V_4$; and a clocked lowpass filter 240 configure to receive a reference voltage $V_{REF}$ and output the control signal $V_C$ in accordance with the pulsed signal $V_4$.

Figure 3A:
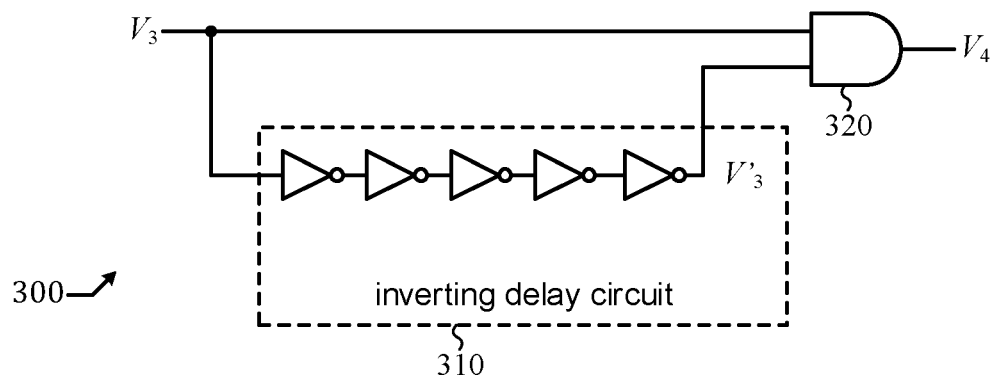
FIG. 3A shows a schematic diagram of a pulse generator that can be used in the crystal oscillator of FIG. 2.
Figure 3B:
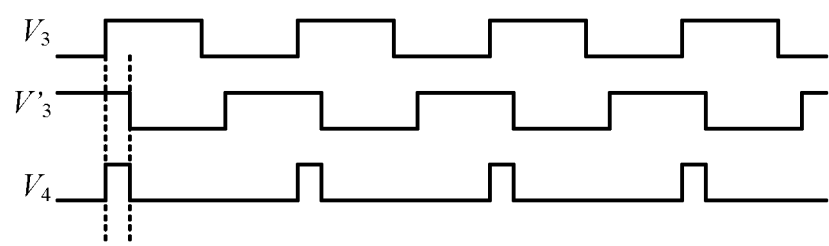
FIG. 3B shows a timing diagram of the pulse generator of FIG. 3A.

A schematic diagram of a pulse generator 300 that can be used to embody the pulse generator 230 is shown in FIG. 3A. The pulse generator 300 comprises an inverting delay circuit 310 configured to receive $V_3$ and output an inverted delay signal $V'_3$, and an AND gate 320 configured to receive $V_3$ and $V'_3$ and output $V_4$. The inverting delay circuit 310 comprises a cascade of an odd number of inverters (by way of example but not limitation, five inverters are shown). A timing diagram of the pulse generator 300 is shown in FIG. 3B. As shown, $V'_3$ is a delayed and then inverted version of $V_3$, and $V_4$ is a pulsed signal, where a first (or rising) edge of $V_4$ approximately aligns with a first (or rising) edge of $V_3$, a second (or falling) edge of $V_4$ approximately aligns with a second (or falling) edge of $V'_3$, and a pulse width of $V_4$ is equal to a delay of $V'_3$ with respect to $V_3$. The pulse generator 300 and the timing diagram of FIG. 3B can be easily understood by those of ordinary skill in the art and thus not further explained.

The crystal 260 embodies a resonant network that establishes oscillation of $V_1$ and $V_2$, while the first shunt capacitor 261, the second shunt capacitor 262, and the $1^{st}$ inverter 210 form a regenerative network that sustains the oscillation; this part is well known in the prior art and thus not further explained. The $2^{nd}$ inverter 220 serves as a buffer. Both the $1^{st}$ inverter 201 and the $2^{nd}$ inverter 220 operate under the third power supply voltage $V_{DD3}$, which is converted from the second power supply voltage $V_{DD2}$ by the source follower 270 comprising an NMOST 271, wherein $V_{DD3}$, $V_C$, and $V_{DD2}$ are voltages of a source, a gate, and a drain, respectively, of NMOST 271. The second power supply voltage $V_{DD2}$ is converted from the first power supply voltage $V_{DD1}$ by the voltage regulator 250. The third power supply voltage $V_{DD3}$ is approximately equal to the control voltage $V_C$ minus a gate-to-source voltage of NMOST 271 and is highly insensitive to the second power supply voltage $V_{DD2}$. In other words, source follower 270 provides an effective voltage regulation, so that not only a noise from the first power supply voltage $V_{DD1}$ but also a circuit noise generated by the voltage regulator 250 can be effectively suppressed. A noise at the control voltage $V_C$, however, will result in a noise at the third power supply voltage $V_{DD3}$.

To address this issue, the clocked lowpass filter 240 is used to filter the reference voltage $V_{REF}$ into the control voltage $V_C$. The clocked lowpass filter 240 comprises: a switch 243 controlled by $V_4$, a serial resistor 241, and a shunt capacitor 242. The serial resistor 241 and the shunt capacitor 242 forms a lowpass filter; this can be easily understood by those of ordinary skill in the art and thus not further explained. The switch 243 is turned on in a pulsed manner, so that a DC (direct current) level of $V_C$ is equal to a DC level of $V_{REF}$, while an AC (alternate current) noise of $V_{REF}$ can be rejected. The serial resistor 241 is a noise contributor, but it can induce noise onto $V_C$ only when the switch 243 is turned on. Due to the pulse nature of $V_4$, the noise of the serial resistor 241 can be reduced. In an embodiment, a pulse width of the pulsed signal $V_4$ is substantially smaller than a period of the third oscillatory signal $V_3$ to allow a substantial noise reduction; in other words, a duty cycle of $V_4$ is substantially smaller than 100%. For instance, a duty cycle of $V_4$ is 10%, and the serial resistor 241 can induce noise onto $V_C$ only 10% of the time, effectively reducing the noise by 90%.

The pulse nature of the clocked lowpass filter 240 introduces a disturbance to the $V_C$, thus disturbing $V_1$, $V_2$, and $V_3$. However, the disturbance is periodic of the same periodicity of $V_1$, $V_2$, and $V_3$. In other words, it is synchronous to the crystal oscillation, can be considered as part of the oscillation, and is therefore not a true disturbance.

Figure 4:
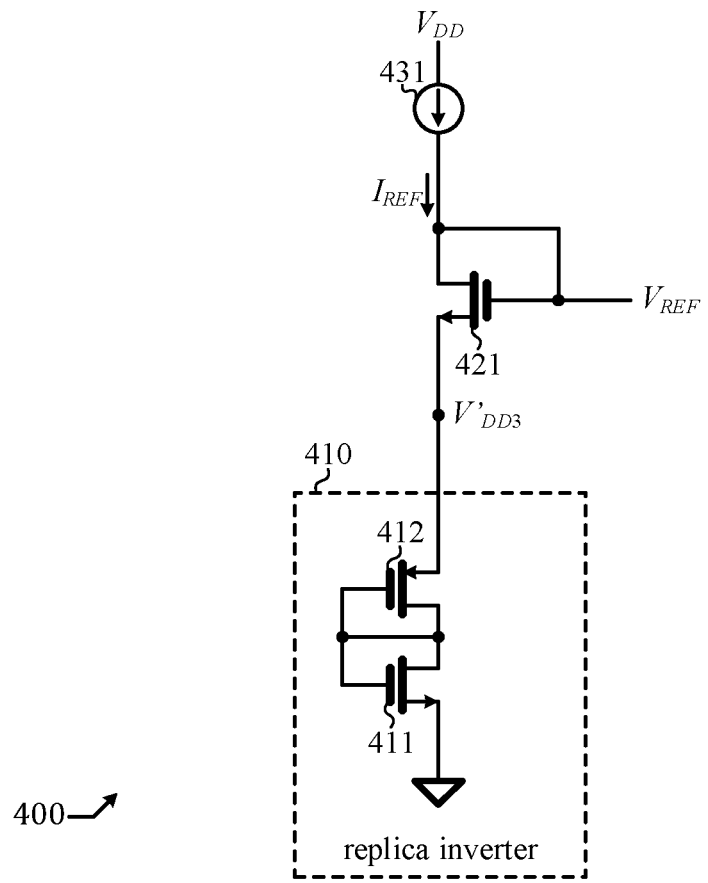
FIG. 4 shows a schematic diagram of an embodiment of a reference voltage generator that can be used to generate the reference voltage used in the crystal oscillator of FIG. 2.

As shown in FIG. 4, in an embodiment, the reference voltage $V_{REF}$ is generated using a reference voltage generator 400 comprising: a current source 431, a diode-connect NMOST 421, and a replica inverter 410 comprising NMOST 411 and PMOST 412. The replica inverter 410 mimics the 1$^{st}$ inverter 210 and the 2$^{nd}$ inverter 220 (with a scaling down of the device width); the current source 431 outputs a reference current $I_{REF}$ that mimics a current drawn by the 1$^{st}$ inverter 210 and the 2$^{nd}$ inverter 220 (with a scaling down ratio); and the diode-connect NMOST 421 mimics NMOST 271 (with a scaling down of the device width). As long as a current drawn by 1$^{st}$ inverter 210 and 2$^{nd}$ inverter 220 can be estimated, a value of the reference current $I_{REF}$ of the current source 431 can be chosen accordingly so that a reference power supply voltage $V'_{DD3}$ of the replica inverter 410 can be approximately equal to the third power supply voltage $V_{DD3}$ and a gate-to-source voltage of NMOST 421 can be approximately equal to a gate-to-source voltage of NMOST 271.

Figure 5:
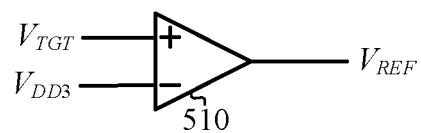
FIG. 5 shows a schematic diagram of an alternative embodiment of a reference voltage generator that can be used to generate the reference voltage used in the crystal oscillator of FIG. 2.

As shown in FIG. 5, in an alternative embodiment, the reference voltage $V_{REF}$ is generated using an alternative voltage generator 500 comprising an operational amplifier 510 configured to output $V_{REF}$ in accordance with a difference between a target voltage $V_{TGT}$ and the third power supply voltage $V_{DD3}$. The operational amplifier 510, the clocked lowpass filter 240, and the source follower 270 form a negative feedback control loop to adjust $V_{REF}$ to cause $V_{DD3}$ to be approximately equal to $V_{TGT}$. Operational amplifiers are well understood by those of ordinary skill in the art and thus not described in detail.

The 2$^{nd}$ inverter 220 serves a purpose of complementing the 1$^{st}$ inverter 210 so as to present a more balanced load to the third power supply voltage $V_{DD3}$. This is beneficial but not absolutely needed. In another embodiment, the 2$^{nd}$ inverter 220 is removed, and the pulse generator receives $V_2$ instead of $V_3$.

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:

1. A crystal oscillator comprising:
   a voltage regulator configured to receive a first power supply voltage and output a second power supply voltage;
   a source follower configured to receive the second power supply voltage and output a third power supply voltage in accordance with a control voltage;
   a first inverter operating under the third power supply voltage and configured to receive a first oscillatory signal at a first node and output a second oscillatory signal at a second node;
   a second inverter operating under the third power supply voltage and configured to receive the second oscillatory signal and output a third oscillatory signal;
   a crystal placed across the first node and the second node;
   a first shunt capacitor configured to shunt the first node to ground;
   a second shunt capacitor configured to shunt the second node to the ground; and
   a clocked lowpass filter configured to receive a reference voltage and output the control voltage in accordance with a pulsed signal, which is synchronous with the third oscillatory signal;
   wherein a first edge of the pulsed signal approximately aligns with a first edge of the third oscillatory signal, and a pulse width of the pulsed signal is substantially smaller than a period of the third oscillatory signal.

2. The crystal oscillator of claim 1, wherein the pulsed signal is generated by a pulse generator comprising: an inverting delay circuit configured to receive the third oscillatory signal and output an inverted delay signal that is an inversion of a delayed version of the third oscillatory signal; and an NAND gate configured to receive the third oscillatory signal, the inverted delay signal and output the pulsed signal.

3. The crystal oscillator of claim 1, wherein the reference voltage is generated by a reference generator comprising: a current source configured to output a reference current; a NMOST (n-channel metal-oxide semiconductor transistor) configured in a diode connect topology to receive the reference current from a drain of the NMOST and establish a reference supply voltage at a source of the NMOST; and a replica inverter operating under the reference supply voltage.

4. A crystal oscillator comprising:
   a voltage regulator configured to receive a first power supply voltage and output a second power supply voltage;
   a source follower configured to receive the second power supply voltage and output a third power supply voltage in accordance with a control voltage;
   a first inverter operating under the third power supply voltage and configured to receive a first oscillatory signal at a first node and output a second oscillatory signal at a second node;
   a second inverter operating under the third power supply voltage and configured to receive the second oscillatory signal and output a third oscillatory signal;
   a crystal placed across the first node and the second node;
   a first shunt capacitor configured to shunt the first node to ground;
   a second shunt capacitor configured to shunt the second node to the ground; and
   a clocked lowpass filter configured to receive a reference voltage and output the control voltage in accordance with a pulsed signal, which is synchronous with the third oscillatory signal;
   wherein the reference voltage is generated using an operational amplifier configured to output the reference voltage in accordance with a difference between a target voltage and the third power supply voltage.

5. The crystal oscillator of claim 1, wherein the clocked lowpass filter comprises a serial connection of a switch controlled by the pulsed signal and a serial resistor, and a shunt capacitor.

6. A crystal oscillator comprising:
   a voltage regulator configured to receive a first power supply voltage and output a second power supply voltage;
   a source follower configured to receive the second power supply voltage and output a third power supply voltage in accordance with a control voltage;
   a first inverter operating under the third power supply voltage and configured to receive a first oscillatory signal at a first node and output a second oscillatory signal at a second node;

a crystal placed across the first node and the second node;
a first shunt capacitor configured to shunt the first node to ground;
a second shunt capacitor configured to shunt the second node to the ground; and
a clocked lowpass filter configured to receive a reference voltage and output the control voltage in accordance with a pulsed signal, which is synchronous with the second oscillatory signal;
wherein a first edge of the pulsed signal approximately aligns with a first edge of the second oscillatory signal, and a pulse width of the pulsed signal is substantially smaller than a period of the second oscillatory signal.

7. The crystal oscillator of claim 6, wherein the reference voltage is generated by a reference generator comprising: a current source configured to output a reference current; a NMOST (n-channel metal-oxide semiconductor transistor) configured in a diode connect topology to receive the reference current from a drain of the NMOST and establish a reference supply voltage at a source of the NMOST; and a replica inverter operating under the reference supply voltage.

8. The crystal oscillator of claim 6, wherein the reference voltage is generated using an operational amplifier configured to output the reference voltage in accordance with a difference between a target voltage and the third power supply voltage.

* * * * *